United States Patent
Yamazaki et al.

(10) Patent No.: US 6,380,011 B1
(45) Date of Patent: Apr. 30, 2002

(54) SEMICONDUCTOR DEVICE AND A METHOD OF MANUFACTURING THE SAME

(75) Inventors: Shunpei Yamazaki, Tokyo; Setsuo Nakajima, Kanagwa; Ritsuko Kawasaki, Kanagawa, all of (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 09/363,954

(22) Filed: Jul. 29, 1999

(30) Foreign Application Priority Data

Aug. 7, 1998 (JP) .......................... 10-223883

(51) Int. Cl.⁷ .......................... H01L 21/00; H01L 21/84
(52) U.S. Cl. .................. 438/163; 438/159; 438/166; 257/69; 257/72
(58) Field of Search .................. 438/149, 160, 438/164, 166, 158, 161, 163; 257/59, 69, 72; 349/138

(56) References Cited

U.S. PATENT DOCUMENTS

| | | | |
|---|---|---|---|
| 5,641,974 A | * | 6/1997 | den Boer et al. ............. 257/59 |
| 5,780,871 A | * | 7/1998 | den Boer et al. ............. 257/59 |
| 5,837,619 A | * | 11/1998 | Adachi et al. ............. 438/795 |
| 5,880,018 A | * | 3/1999 | Boeck et al. ............. 438/619 |
| 5,882,165 A | * | 3/1999 | Maydan et al. ............. 414/217 |
| 5,917,571 A | * | 6/1999 | Shimada ............. 349/138 |
| 6,177,302 B1 | | 1/2001 | Yamazaki et al. |

FOREIGN PATENT DOCUMENTS

| | | | |
|---|---|---|---|
| JP | 62-104171 | 5/1987 | |
| JP | 01-184928 | 7/1989 | |
| JP | 06-132536 | * 5/1994 | ........ 438/FOR 183 |

OTHER PUBLICATIONS

Sun et al., "Properties of metalorganic chemical vapor deposited tantalum thin films", Oct. 1995, IEEE, pp. 547–549.*

Sano et al., "High quality SiO/sub 2//Si interfaces of poly–crystalline silicon thin film transistors by annealing in wet atmosphere", May 1995, IEEE, pp. 157–160.*

Lan et al., "Planarized copper gate hydrogenated amorphous–silicon thin–film transistors for AM–LCDs", Jun. 1998, IEEE, pp. 130–131.*

* cited by examiner

Primary Examiner—Wael Fahmy
Assistant Examiner—Fernando Toledo
(74) Attorney, Agent, or Firm—Cook, Alex, McFarron, Manzo, Cummings & Mehler, Ltd.

(57) ABSTRACT

To provide a technique required for purifying the interface between an active layer and an insulating film. On a substrate (101), a gate wiring (103) is formed and the surface thereof is covered with a gate oxide film (104). Then, a first insulating film (105a), a second insulating film (105b), a semiconductor film (106) and a protective film (107) are sequentially formed and layered without exposing them to the air. Further, the semiconductor film (106) is irradiated with laser light through the protective film (107). In this way, a TFT may be given good characteristics by completely purifying the interface of the semiconductor film.

41 Claims, 7 Drawing Sheets

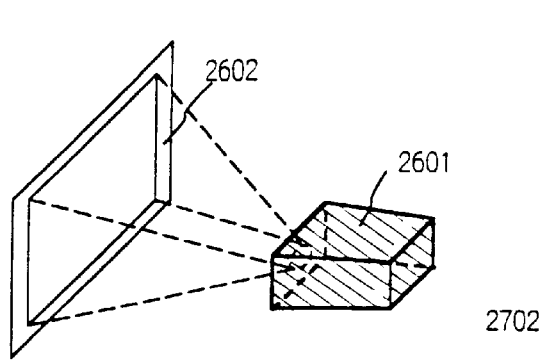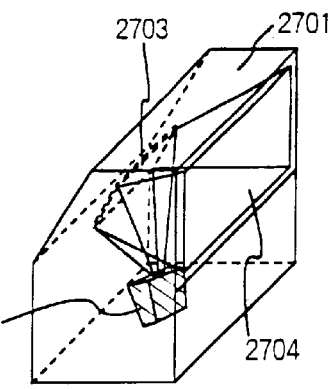
Fig. 9A  Fig. 9B
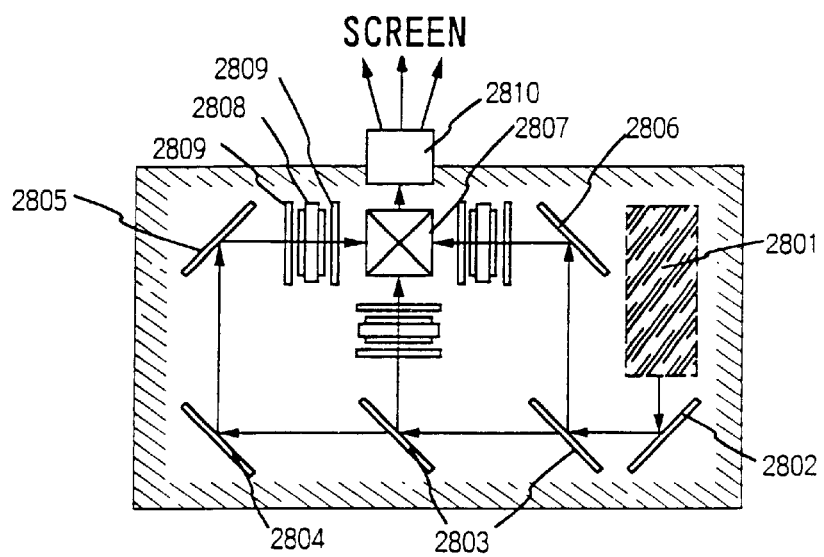
Fig. 9C
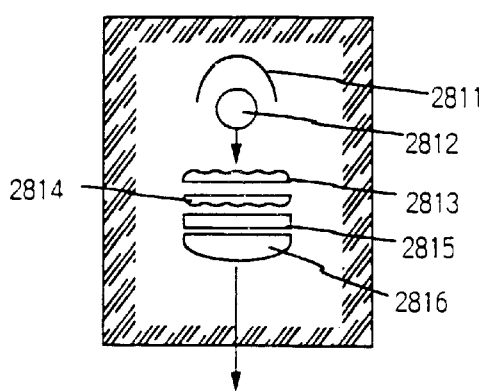
Fig. 9D

SEMICONDUCTOR DEVICE AND A METHOD OF MANUFACTURING THE SAME

BACKGROUND OF THE INVENTION

1. Field of the Invention

The present invention relates to a semiconductor device comprising in its composition a thin film transistor (hereinafter, referred to as TFT) that uses a semiconductor thin film, and to a method of manufacturing the same. In this specification, the term "semiconductor device" denotes devices in general which may function with utilization of semiconductor characteristics, and hence semiconductor circuits, electro-optical devices and electronic equipments in this specification all fall into the semiconductor device.

2. Description of the Related Art

In recent years, what have attracted attention is an active matrix type liquid crystal display device including a circuit constituted of a TFT that uses a polysilicon film. The device is designed to control on matrix-basis, by means of a plurality of pixels arranged in matrix, the electric field that is applied onto liquid crystal, thereby realizing image display of high definition.

In an active matrix type liquid crystal display device, an image is displayed by controlling with a pixel TFT formed for every pixel the voltage applied to liquid crystal. Today's display device has a million or more pixels besides many other components, so that huge numbers of pixel TFTs have to be formed with good yield while holding down the variation in their characteristics.

The interface between an active layer and a gate insulating film may be given as one of parameters that influence the TFT characteristics most. When contaminated, this interface affects in an instant the TFT characteristics. Purifying the interface at which the active layer and other insulating film are brought into contact is therefore necessary to obtain good TFT characteristics.

SUMMARY OF INVENTION

The object of the present invention is to provide a method for forming a TFT exhibiting good electrical characteristics and, further, to provide a semiconductor device using such a TFT, the semiconductor device including a semiconductor circuit, an electro-optical device, an electronic equipment and the like.

The present invention is directed to a technique for purifying the interface between an active layer and an insulating film in a TFT. The gist of the present invention resides in that, on forming a TFT of bottom gate structure (typically, an inverted staggered structured), at least a channel formation region of a semiconductor film to be an active layer is not exposed to the air even once. With this construction, contamination at the interface of the active layer is prevented to realize a TFT exhibiting stable and good electrical characteristics.

According to one aspect of the present invention there is provided a method of manufacturing a semiconductor device that includes sequentially forming and layering, over a substrate having a gate wiring formed thereon, a gate insulating film, a semiconductor film and a protective film without exposing them to the air. The semiconductor film is then irradiated with ultraviolet light or infrared light to form a semiconductor film containing crystals. Then, an impurity region containing crystals is formed in the semiconductor film, while using as a mask the protective film. Next, the semiconductor film containing crystals is patterned into an island-like shape to form an active layer.

According to another aspect of the present invention, there is provided a method of manufacturing a semiconductor device that includes the additional step of etching the gate insulating film while using as a mask the active layer.

According to still another aspect of the present invention, there is provided a method of manufacturing a semiconductor device that includes forming a gate wiring on a substrate. Then, the gate wiring is oxidized to form a gate oxide film on the surface of the gate wiring. Next, a gate insulating film, a semiconductor film and a protective film are sequentially formed and layered on the substrate where the gate wiring is formed without exposing them to the air. Then, the semiconductor film is irradiated with ultraviolet light or infrared light to form a semiconductor film containing crystals. An impurity region is then formed in the semiconductor film containing crystals while using as a mask the protective film. The semiconductor film containing crystals is then patterned into an island-like shape to form an active layer.

According to yet another aspect of the present invention, there is provided a method of manufacturing a semiconductor device including the additional step of sequentially etching the gate insulating film and the gate oxide film while using as a mask the active layer.

In this specification, the term "semiconductor film containing crystals" denotes a single crystal semiconductor film or a crystalline semiconductor film containing a crystal grain boundary (which includes a polycrystalline semiconductor film and a microcrystalline semiconductor film), and is used to clearly distinguish those films from a semiconductor film that is amorphous all over its area (an amorphous semiconductor film). Needless to say, what is mentioned simply as "semiconductor film" includes an amorphous semiconductor film in addition to semiconductor films containing crystals. In the invention of the present application, the gate wiring may be formed solely of a tantalum film, or may be formed of a laminated film in which a tantalum film and a tantalum nitride film are layered. Of course, other conductive film or a silicon film may be layered on those films.

Further, it is effective to use as the gate insulating film a laminated film containing one layer of silicon nitride film (for example, a laminated film in which a silicon oxide film and a silicon nitride film are layered). This construction has an effect that the silicon nitride film prevents diffusion of contaminants from the substrate. It is also effective to use as the gate insulating film a laminated film containing one layer of BCB (benzocyclobutene) film. The BCB film, having very high flatness, may eliminate a level difference due to the gate wiring to enhance the flatness of all the thin films that are to be formed above the BCB film.

An another aspect of the above invention, the gate oxide film may be formed by any measure of a plasma oxidation method, a thermal oxidation method and an anodic oxidation method. The plasma oxidation method with which process is simple is particularly effective in terms of improvement in the throughput.

BRIEF DESCRIPTION OF THE DRAWINGS

In the accompanying drawings:

FIGS. 9A through 9D are views each showing an example of a semiconductor device (electronic equipment).

DESCRIPTION OF THE PREFERRED EMBODIMENT

Description will be given in detail on embodiment modes of the present invention by means of Embodiments shown below.

[Embodiment 1]

In this embodiment, description will be made on an example in which an inverted staggered structure TFT is manufactured using the present invention. Though description in this embodiment is given centering on one TFT, it is needless to say that a plurality of TFTs may be simultaneously formed on the same substrate. Reference will be made to FIGS. 1A to 3D for description.

FIGS. 1A to 1F are sectional views showing a portion for TFT formation. First, a glass substrate is prepared as a substrate 101. A substrate that may be used as the substrate 101 other than a glass one includes a quartz substrate, a ceramics substrate, a stainless substrate, a metal (such as tantalum, tungsten and molybdenum) substrate, a semiconductor substrate and a plastic substrate (such as polyethylene terephthalate substrate).

An insulating film is formed thereon as a base film 102. In this embodiment, a silicon nitride film is used to prevent diffusion of contaminants from the glass substrate 101. It is an effective option to further provide a heat radiating layer made of, for example, a metal film or an aluminum nitride film between the substrate 101 and the base film 102.

Next, a gate wiring 103 is formed so as to have a lamination structure in which a tantalum film is sandwiched between tantalum nitride films. The structure may be replaced by another lamination structure in which a tantalum film and a tantalum nitride film are layered. Other conductive materials may also be employed.

The gate wiring 103 is then oxidized to form on its surface a gate oxide film 104. As a method of forming the gate oxide film 104, any measure of a plasma oxidation method, an anodic oxidation method and a thermal oxidation method may appropriately be used. However, a plasma oxidation method would be preferable in consideration for the throughput.

Figure 1A:
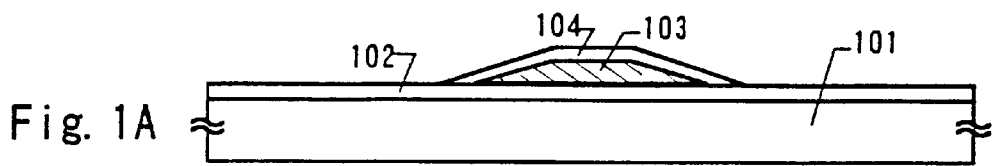
FIGS. 1A to 1F are views showing a manufacturing process of a TFT.

The state shown in FIG. 1A is thus obtained. At this time, the gate wiring 103 extends lengthwise and crosswise on the substrate and finally reaches a gate contact portion. The gate contact portion is a contact portion for connecting the gate wiring and an external wiring line, and is formed on the same substrate. A sectional view of this gate contact portion is shown in FIG. 2A.

Figure 2A:
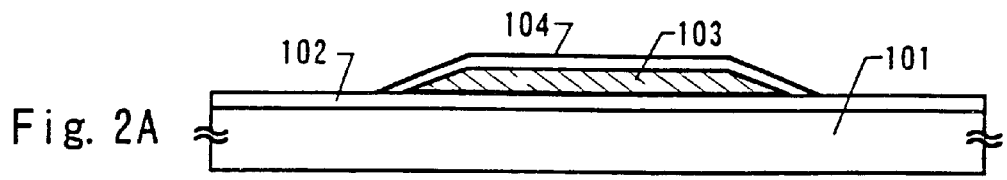
FIGS. 2A to 2F are views showing the manufacturing process of a TFT.

FIG. 2A shows the structure in section of the gate contact portion at the time when the state of FIG. 1A is obtained. Accordingly, the same reference symbols denote the same parts in FIG. 1A and FIG. 2A.

After obtainment of the state of FIG. 1A, a first insulating film 105a, a second insulating film 105b, a semiconductor film 106 and a protective film 107 are sequentially formed and layered without exposing them to the air. At this time, either a plasma CVD method or a sputtering method may be employed as a film formation measure and, in either case, contaminants from the air may attach to not a single interface of the interfaces between adjacent layers by strictly holding the films under a highly evacuated environment to keep them away from the air. As a result, very clean interfaces may be realized.

Used in this embodiment for the first insulating film 105a is a silicon nitride film with a thickness of 50 nm; the second insulating film 105b, a silicon oxide film with a thickness of 150 nm; the semiconductor film 106, an amorphous silicon film with a thickness of 50 nm; and the protective film 107, a silicon oxide film with a thickness of 100 nm. Each film thickness does not need to be limited to one in this embodiment, but may be determined appropriately on discretion of a person who carries out the invention.

A laminated film in which the first insulating film 105a and the second insulating film 105b are layered is employed as the gate insulating film in this embodiment. However, it may be replaced by a single layer where one of the first insulating film and the second insulating film is omitted, or by a lamination structure comprising three or more layers.

Though this embodiment uses an amorphous silicon film for the semiconductor film 106, a microcrystalline silicon film may alternatively be used or a semiconductor film containing crystals (such as a polycrystalline silicon film) may be formed instead at this point. Further, exemplified in this embodiment is silicon, but it may be a semiconductor such as a compound semiconductor (typically, silicon germanium).

Figure 1B:
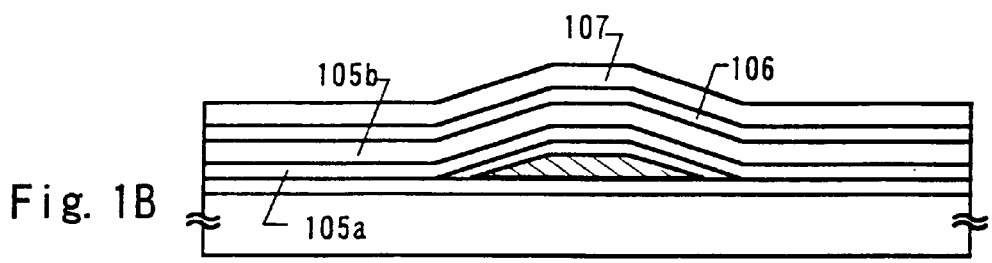
Figure 2B:
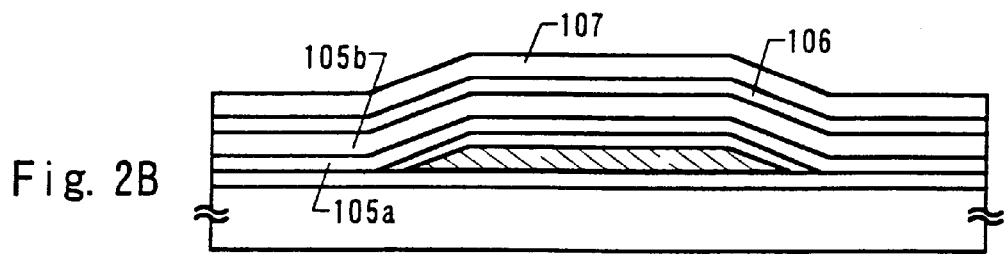

The state of FIG. 1B is thus obtained. At this time, the gate contact portion has the structure shown in FIG. 2B. Reference symbols used in FIG. 2B are identical with the reference symbols used in FIG. 1B.

After obtaining the state of FIG. 1B, the semiconductor film 106 is irradiated with ultraviolet light or infrared light. In this embodiment, excimer laser light is irradiated. The excimer laser light in this embodiment is beam-shaped into a linear shape to irradiate. The irradiation condition consists of pulse frequency of 30 Hz and laser energy density of 100 to 500 mJ/cm$^2$. In this embodiment, laser energy density is set to 350 mJ/cm$^2$.

Through this step, the semiconductor film 106 is crystallized and is changed into a semiconductor film 108 containing crystals. Concretely, the semiconductor film containing crystals is a polycrystalline silicon film in this embodiment. The semiconductor film 106 at this time is irradiated with laser light through the protective film 107, thereby not inviting a fear of contaminants from the process atmosphere being mixed in the semiconductor film 106. In other words, the semiconductor film 106 can be crystallized while maintaining cleanness of the interface of the semiconductor film 106.

The term "crystallization" is used here because the film 106 in this embodiment is an amorphous silicon film at the stage prior to the laser irradiation (film formation stage). However, if the film 106 at the film formation stage is a polycrystalline silicon film or a microcrystalline silicon film, the expression is not proper. In that case, it would be properly described as improvement in crystallinity. Namely, the irradiation with laser changes the semiconductor film into one having higher crystallinity.

Figure 1C:
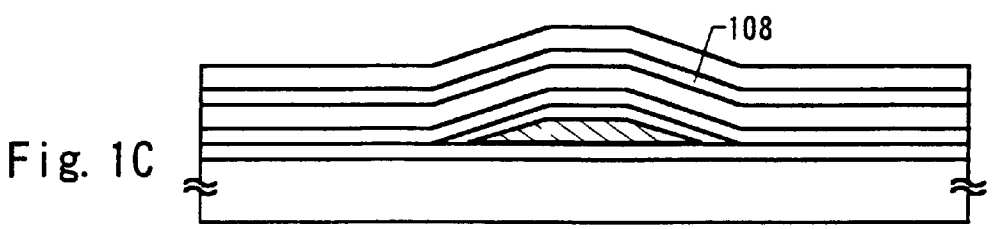
Figure 2C:
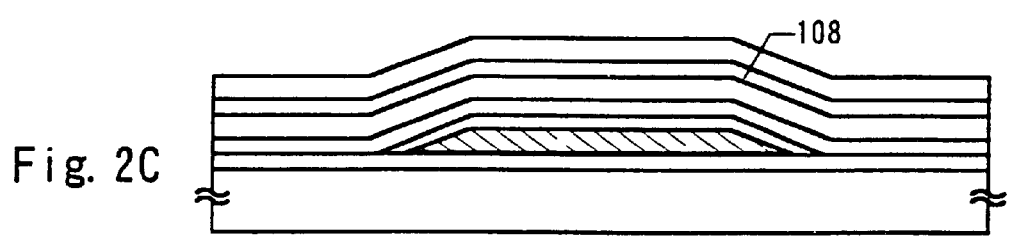

The state of FIG. 1C is thus obtained. The gate contact portion at this time has the structure as shown in FIG. 2C. Reference symbols used in FIG. 2C are identical with the reference symbols used in FIG. 1C.

Obtainment of the state of FIG. 1C is followed by patterning of the protective film 107 to form another protective film 109. This patterning uses a back-surface exposure method to form in a self-alignment manner the protective film 109 while using the gate wiring 103.

Upon completion of the protective film 109, phosphorus ions are added as impurity ions for giving N type by a plasma doping method, an ion implantation method or a vapor phase diffusion method to form a first impurity region 110. At this time, a part of the semiconductor film 108 containing crystals is protected by the protective film 109.

Exemplified in this embodiment is the case of an N channel type TFT. If a P channel type TFT is aimed, boron ions are added in this step as impurity ions for giving P type.

Figure 1D:
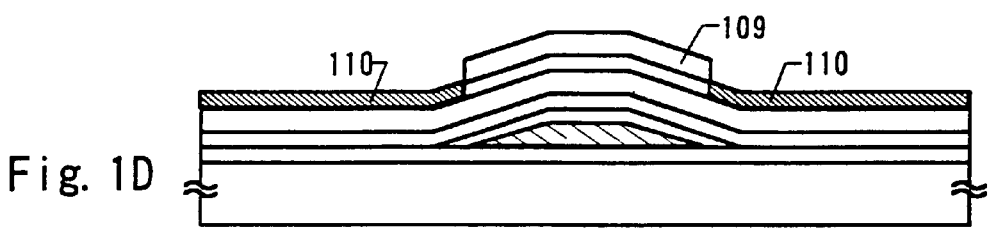
Figure 2D:
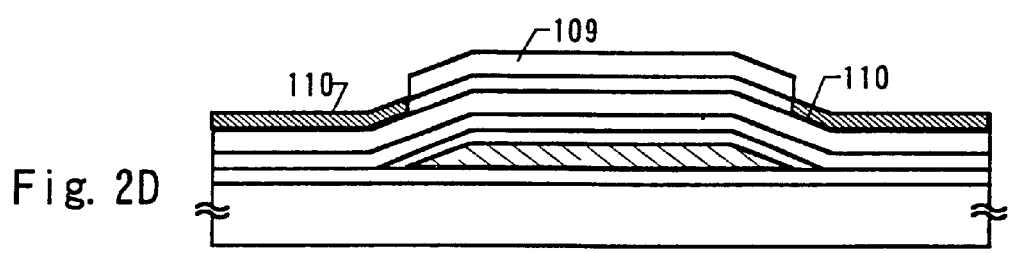
Figure 3A:
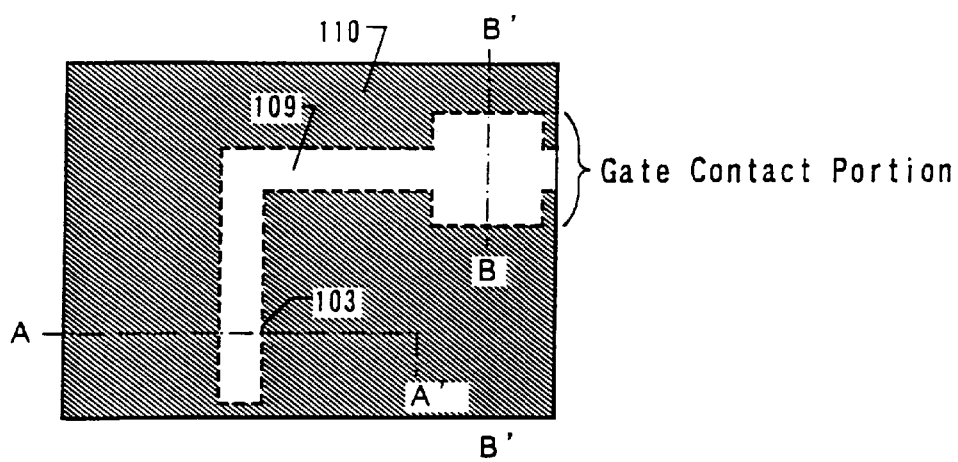
FIGS. 3A to 3D are views showing the manufacturing process of a TFT.

In this way, the state shown in FIG. 1D is obtained. At this time, the gate contact portion has the structure as shown in FIG. 2D. Reference symbols used in FIG. 2D are identical with the reference symbols used in FIG. 1D. The gate contact portion in FIGS. 1D and 2D when seen from the top surface at this point is shown in FIG. 3A. In FIG. 3A, a sectional view cut along the line A–A' corresponds to the view of FIG. 1D, and a sectional view cut along the line B–B' corresponds to the view of FIG. 2D. Reference symbols used in FIG. 3A are identical with the reference symbols used in FIGS. 1D and 2D.

After obtaining the state of FIG. 1D, patterning is again performed to form a protective film 111 out of the protective film 109. This time, mask alignment is required. Phosphorus ions are added for the second time in a concentration lower than in the first time. A second impurity region 112 is thus formed. A part of the semiconductor film 108 containing crystals is again protected by a protective film, this time, the protective film 111. Though phosphorus ions are added also in the first impurity regions 110, the addition is limited to an amount smaller by 2 to 3 digits, and hence it may be considered that the addition does not practically cause any change.

Formed through those two impurity addition steps are regions (a part of the first impurity region 110) later to be a source region and a drain region, and regions (a part of the second impurity region 112) later to be LDD regions. After forming the impurity regions, the impurity ions are activated by furnace annealing or laser annealing.

Figure 1E:
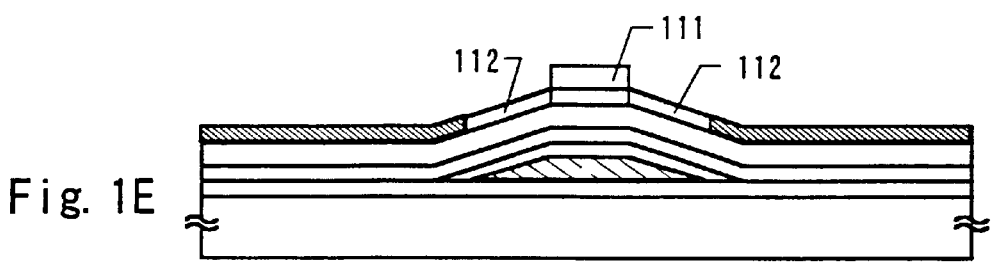
Figure 2E:
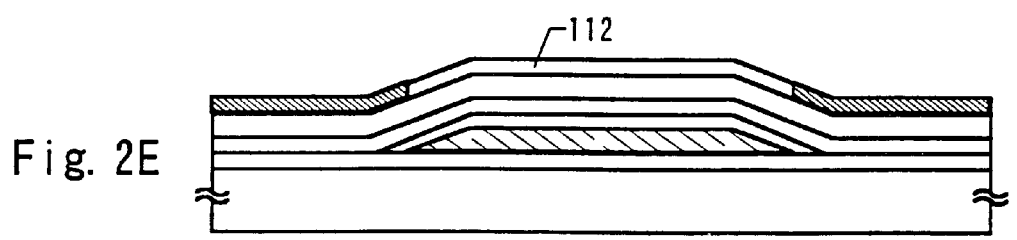
Figure 3B:
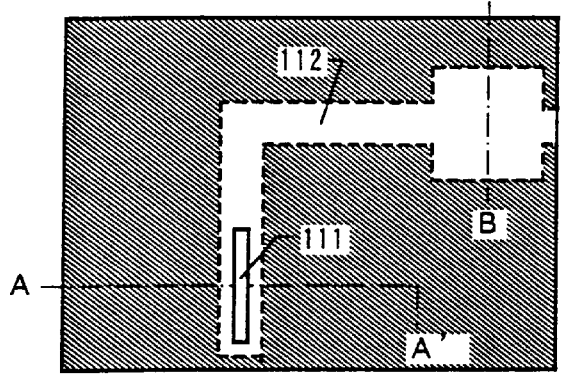

The state shown in FIG. 1E is thus obtained. The sectional view of the gate contact portion at this time is shown in FIG. 2E, and the top view thereof is shown in FIG. 3B. It is sufficient if the protective film 111 is remained so as to cover at least a portion to be a channel formation region.

When the state of FIG. 1E is obtained, the semiconductor film 108 containing crystals is patterned to form an active layer. In the case of this embodiment, the active layer consists of a source region 113, a drain region 114, LDD regions 115 and a channel formation region 116. The interface of the channel formation region 116 (which is in contact with the protective film 117 or with the second insulating film 105b) has not been exposed to the air through the steps up here, not even once, and is very clean.

Figure 3C:
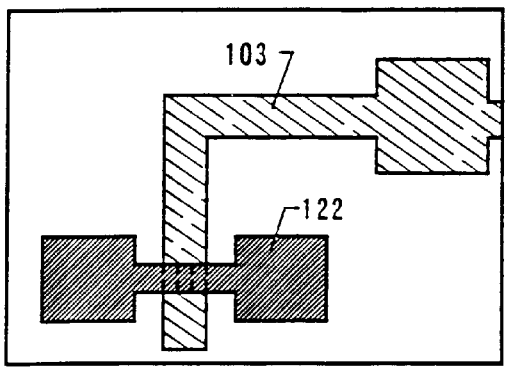

Next, the resist mask as it has been used upon the patterning for the active layer is used as a mask to sequentially etch the second insulating film 105b, the first insulating film 105a and the gate oxide film 104. Shown in FIG. 3C is the state at the time when this step is completed (which is not shown in FIGS. 1C and 2C). In this state, the gate wiring 103 is exposed at regions other than the portion covered with the resist mask 122 (which corresponds to the active layer).

Then formed as an interlayer insulating film 118 is a laminated film consisting of a silicon nitride film with a thickness of 50 nm and a silicon oxide film with a thickness of 900 nm. Of course, other insulating film made of a resin material (such as polyimide and acryl) may be used.

After forming the interlayer insulating film 118, contact holes are formed to form a conductive film that is then patterned to form a source wiring 119 and a drain wiring 120. In some cases, at the gate contact portion of this point of time, a native oxide film is formed on the surface of the gate wiring, and it is desirable to remove the native oxide film by a pretreatment (FIG. 1F).

Figure 2F:
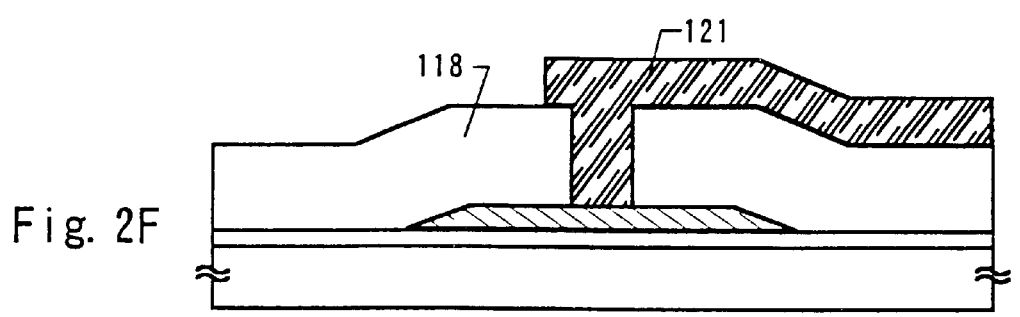

In the gate contact portion at this time, an external wiring line 121 made of the same material that forms the source wiring 119 and the drain wiring 120 is formed so as to be connected with the gate wiring 103 (FIG. 2F).

Figure 3D:
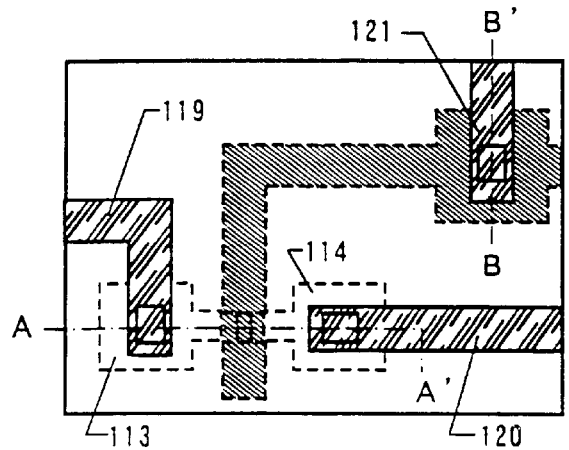

The top view thereof is as shown in FIG. 3D. Needless to say, a sectional view cut along the line A–A' corresponds to the view in FIG. 1F and a sectional view cut along the line B–B' corresponds to the view in FIG. 2F.

Figure 1F:
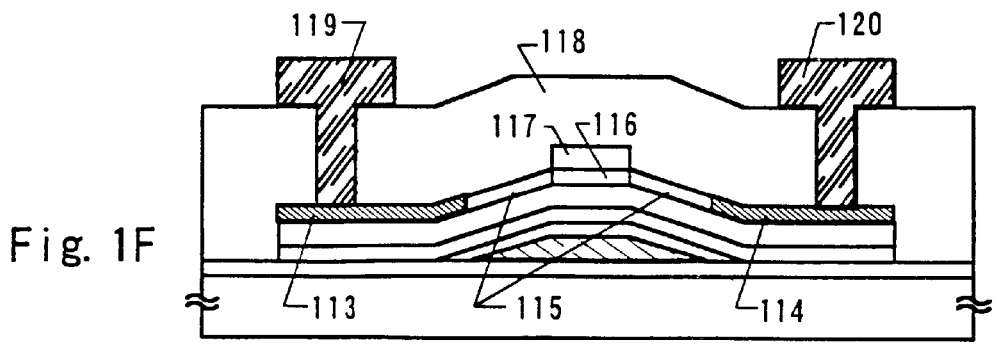

Thereafter, a hydrogenation treatment is conducted at 300° C. for 2 hours to complete a TFT having the sectional structure as shown in FIG. 1F. The TFT structure in this embodiment of course does not limit the TFT structure of the present invention.

A first feature of this embodiment resides in that all the insulating films which are in contact with the semiconductor film 106 are serially formed and layered while not being exposed to the air. This keeps cleanness of the interface of the active layer and realizes a TFT exhibiting good electrical characteristics.

A second feature is that covering the gate wiring 103 with the gate oxide film 104 uniforms the grain size of the semiconductor film 108 containing crystals. There is some possibility that if the gate oxide film is not provided, only the grain size at a portion that overlaps with the gate wiring is decreased. It is preferable to provide the gate oxide film 104 in order to prevent such a phenomenon.

Further, a third feature is the use of the resist mask 122 as a mask for etching the second insulating film 105b, the first insulating film 105a and the gate oxide film 104, which is effective in securing good ohmic contact between the gate wiring 103 and the external wiring line 121.

This is because the presence of the gate oxide film, the first insulating film and the second insulating film on the gate wiring 103 at the gate contact portion makes it difficult to simultaneously form the contact holes on the source region, the drain region and the gate wiring. If the step above is conducted in advance, the source region, the drain region and the gate wiring may be exposed by merely etching the interlayer insulating film 118.

When a tantalum-based material is used for the gate wiring 103 as in this embodiment, there arise a problem of great difficulty in etching the gate oxide film which is tantalum oxide. Further, if a part of the silicon film at somewhere on the substrate is exposed during etching the tantalum oxide film, the exposed silicon film also is undesirably etched. Removing in advance the gate oxide film 104 is very effective to avoid those problems.

By carrying out this embodiment having the construction as above, a basic TFT structure shown in FIG. 1F is completed. However, to further modify the TFT structure as required does not put any inhibition to the effect of the present invention.

That is, it is possible to fabricate an N channel TFT and a P channel TFT on the same substrate to form a CMOS circuit. Such a CMOS circuit constructs a driver circuit or a signal processing circuit of an active matrix type liquid crystal display device. If a pixel electrode is formed so as to establish connection with the drain wiring 120 in a state of separation with an insulating film, it is possible to construct a pixel matrix circuit of an active matrix type liquid crystal display device.

As described above, to form an active matrix type liquid crystal display device utilizing the present invention is easy if a known measures is used. The present invention may be applied not only to an electro-optical device such as a liquid crystal display device but to formation of a semiconductor circuit consisted solely of a logic circuit.

[Embodiment 2]

In this embodiment, description will be made with reference to FIG. 4 on an example in which a TFT having a different structure from that of a TFT in Embodiment 1 is manufactured.

In this embodiment, a PET (polyethylene terephthalate) substrate is used for a substrate 401. A silicon nitride oxide (expressed as $SiO_xN_y$) film is formed as a base film 402; a laminated film in which a tantalum film and a tantalum nitride film are layered is formed as a gate wiring 403; and a titanium film is formed as a metal film 404. It is appropriate that the gate wiring 403 and the metal film 404 are formed and layered, and are etched together when forming a pattern of the gate wiring.

Figure 5A:
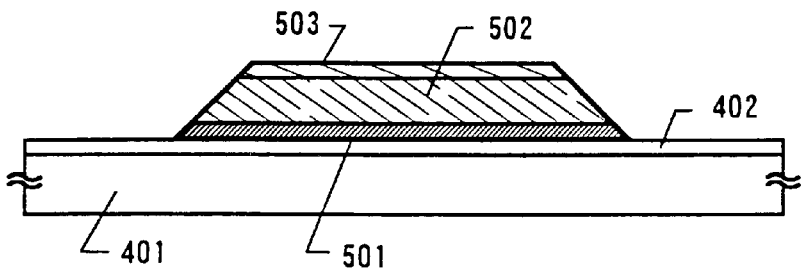
FIGS. 5A and 5B are views each showing the structure of a gate wiring.
Figure 5B:
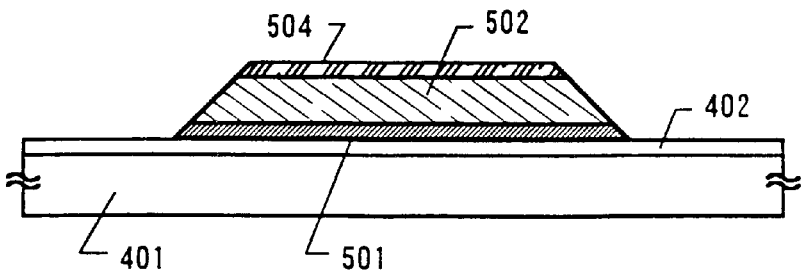

Here, reference is made to FIGS. 5A and 5B that are enlarged views centered on the gate wiring 403 and the metal film 404. In FIG. 5A, the base film 402 is formed on the substrate 401, and a tantalum nitride film 501, a tantalum film 502 and a metal film (titanium film) 503 are formed and layered thereon.

The metal film 503 (denoted by 404 in FIG. 4A) is formed for the purpose of preventing the surface layer of the tantalum film or the tantalum nitride film from being oxidized or absorbing hydrogen. A metal film other than the titanium film may be used as long as the metal have the same effect. As shown in FIG. 5B, the same effect may be obtained with the use of a semiconductor film 504 such as a silicon film or a silicon germanium film.

Figure 4A:
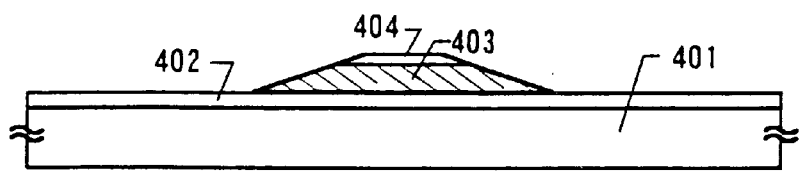
FIGS. 4A to 4C are views showing a manufacturing process of a TFT.

After the state of FIG. 4A is obtained, a BCB (benzocyclobutene) film of 100 nm to 1 μm (preferably 500 to 800 nm) in thickness is formed as a first insulating film 405. In this step, the film thickness is required to be thick enough to completely flatten the level difference due to the gate wiring 403. Since a BCB film has great flattening effect, sufficient flattening is possible with not so thick a film.

Figure 4B:
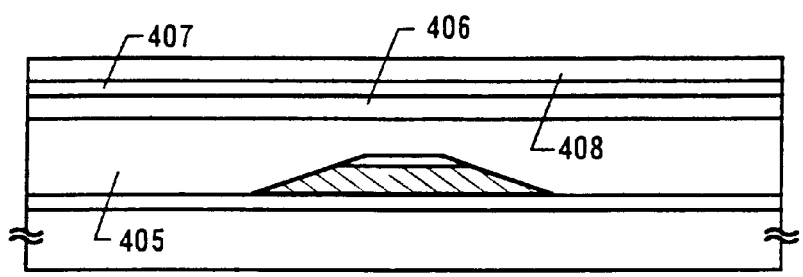

The formation of the first insulating film 405 is followed by sequential formation and layering of a second insulating film (silicon nitride film) 406, a semiconductor film (amorphous silicon film) 407 and a protective film (silicon oxide film) 408, without exposing them to the air. The insulating film and the semiconductor film thus serially formed are all flat as they are formed on the flat surface. In this way, the state of FIG. 4B is obtained.

Next, the semiconductor film 407 is irradiated with excimer laser light through the protective film 408 so as to be changed into a semiconductor film 409 containing crystals (polycrystalline silicon film). Conditions on this step of crystallizing with laser are the same as in Embodiment 1. Obtained at this time is a polycrystalline silicon film of uniform grain size owing to the flat semiconductor film 407.

As described above, a semiconductor film having a flat surface may be obtained by using as the first insulating film 405 a BCB film that is advantageous in terms of flattening. The uniform crystallinity therefore can be ensured over the entire area of the semiconductor film.

The protection of the upper surface of the gate wiring 403 with the metal film (titanium film) 404 may prevent a trouble of increase in wiring resistance that is caused by oxidation of or hydrogen absorption by the gate wiring 403. Further, the gate contact portion at which the gate wiring 403 is readily exposed is advantageous in formation of contact holes.

Figure 4C:
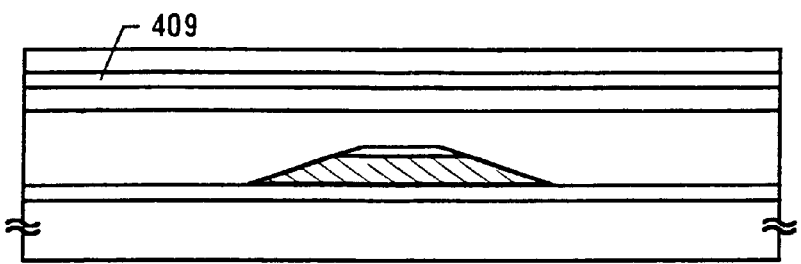

Steps subsequent to the step of FIG. 4C should follow the steps in Embodiment 1 to complete a TFT. A TFT manufactured by to carrying out this embodiment exhibits less varied electrical characteristics. Accordingly, this embodiment may be combined with Embodiment 1.

[Embodiment 3]

In this embodiment, description will be made on an example in which excimer laser light is shaped like a plane to irradiate in the step of FIG. 1C.

In shaping laser light like a plane, the laser light has to be shaped so that the area about several tens $cm^2$ (preferably, 10 $cm^2$ or more) may be irradiated at once. In order to anneal the entire surface to be irradiated with a desired laser energy density, a laser apparatus having a total energy of 5 J or more, preferably having an output of 10 J or more is used.

In that case, the energy density is set to 100 to 800 $mJ/cm^2$, and output pulse width is set to 100 nsec or more, preferably 200 nsec to 1 msec. To realize a pulse width as large as 200 nsec to 1 msec, a plurality of laser apparatuses are coupled with each other to produce, by differentiating synchronism of the respective laser apparatuses, a state in which plural pulses are mixedly present.

By irradiating the laser light having a plane-like beam shape as in this embodiment, a large area may be uniformly irradiated with laser. Namely, crystallinity (including grain size and defects density) of the active layer is made homogenous, and variation in electrical characteristics between TFTs may be reduced.

This embodiment may be combined with Embodiment 1 or 2, and those three embodiments are freely combined with one another.

[Embodiment 4]

Figure 6:
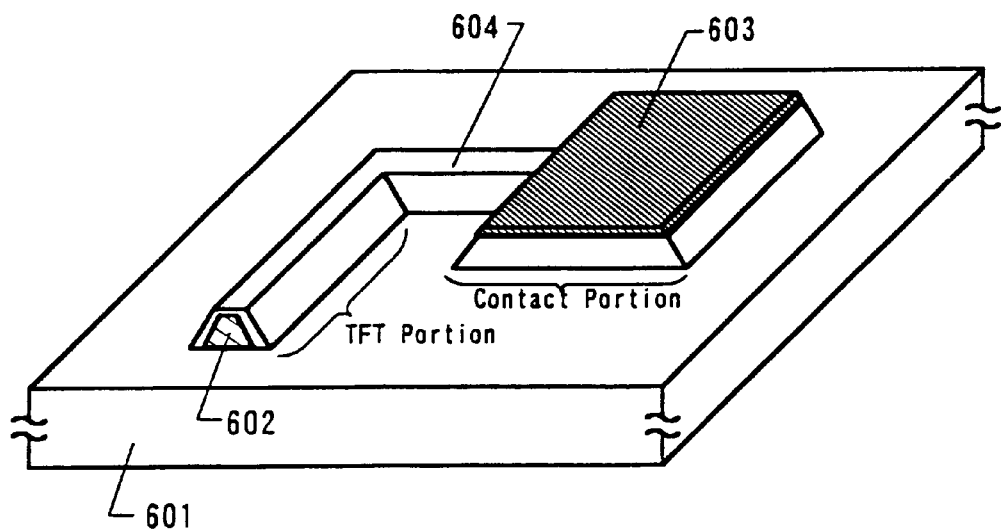
FIG. 6 is a view showing the structure of a gate wiring.

In this embodiment, description will be made on the construction in which a material to cover a gate wiring is differentiated between at a gate contact portion (a portion at which the gate wiring and an external wiring line are electrically connected with each other) and a TFT portion (a portion where the TFT is formed). Reference is made to FIG. 6 for description.

First, a glass substrate on which a base film is provided is prepared as a substrate 601. A tantalum nitride film, a tantalum film and a metal film (a titanium film, in this embodiment) are formed and layered thereon, and are patterned to form a pattern of a gate wiring 602.

The metal film is next patterned so that a metal film 603 is left only at the gate contact portion. After forming the metal film 603, plasma oxidation is then performed to form a gate oxide film (a tantalum oxide film, in this embodiment) 604 on the surface of the gate wiring 602. A thermal oxidation method or an anodic oxidation method may be used instead, of course.

Thereafter, a TFT is manufactured through the steps shown in Embodiment 1. The effects as follows may be obtained by carrying out this embodiment.

1. Owing to the provision of the gate oxide film 604, at the TFT portion, the grain size of the semiconductor film containing crystals which forms an active layer is made uniform.

2. The metal film 603 (or an oxide of the metal film 603) at the gate contact portion is readily removed when forming contact holes, which helps to obtain an ohmic contact.

As the effects described above are obtained, to manufacture a TFT of high performance with high yield is made possible, and consequently, it may be realized that a semiconductor device including a circuit formed of such a TFT is improved in performance and yield.

This embodiment may be combined with any one of Embodiments 1 through 3.

[Embodiment 5]

Figure 7:
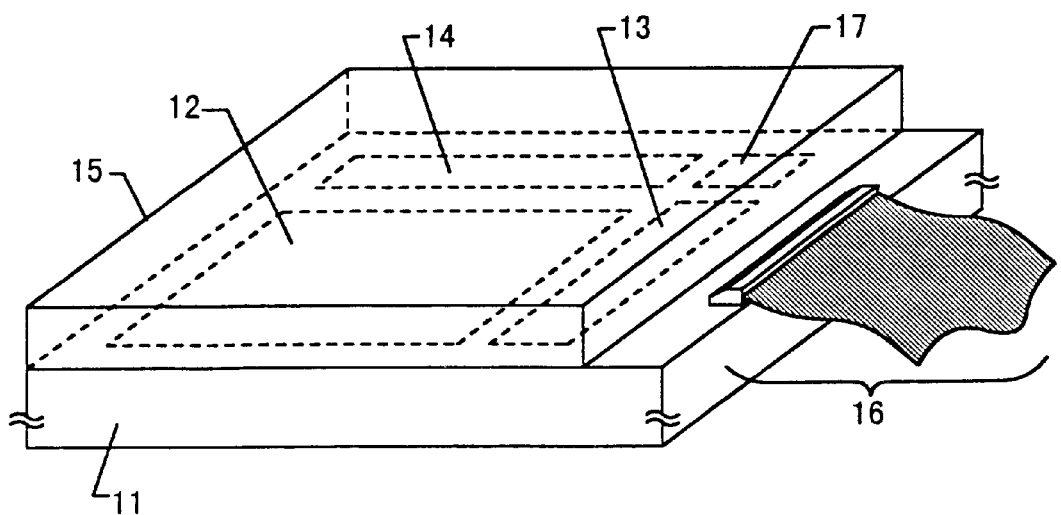
FIG. 7 is a view showing the structure of a semiconductor device (liquid crystal display device)

This embodiment takes up an example of a liquid crystal display device manufactured in accordance with the present invention, which is shown in FIG. 7. As to a manufacturing method of a pixel TFT (pixel switching device) and a cell assembling process, known measures are appropriately used and hence detailed description will be omitted.

In FIG. 7, reference symbol 11 denotes a substrate having an insulating surface (a plastic substrate provided with a silicon oxide film); 12, a pixel matrix circuit; 13, a source driver circuit; 14, a gate driver circuit; 15, an opposite substrate; 16, an FPC (flexible printed circuit); and 17, a signal processing circuit. Formed as the signal processing circuit 17 is a circuit for conducting such processing as ICs have conventionally processed in substitution, an example of which includes a D/A converter, a γ-correction circuit and a signal dividing circuit. Of course, an IC chip may be provided on the substrate to execute signal processing in the IC chip.

Though description is made taking an example of a liquid crystal display device in this embodiment, it is needless to say that the present invention is also applicable to an EL (electroluminescence) display device and an EC (electrochromics) display device as long as it is an active matrix type liquid crystal display device.

Whether it is a transmission type or a reflection type does not matter when a liquid crystal display device is manufactured with the use of the present invention. The person who carries out the invention may freely decide which type to choose. Thus, the present invention may be applied to every active matrix type electro-optical device (semiconductor device).

Upon fabrication of the semiconductor device shown in this embodiment, any construction of Embodiments 1 through 4 may be employed and to use the embodiments in free combination is possible.

[Embodiment 6]

The present invention is applicable to conventional IC techniques in general. That is, it may be applied to all the semiconductor circuits that are distributed in the market at present. For instance, it may be applied to microprocessors such as a RISC processor or an ASIC processor which is integrated on one chip, to a signal processing circuit a typical example of which is a driver circuit for liquid crystal (such as a D/A converter, a γ-correction circuit and a signal dividing circuit), or to a high frequency circuit for a portable device (such as a cellular phone, a PHS: personal handy phone system, and a mobile computer).

A semiconductor circuit such as a microprocessor is provided in various electronic equipments to function as a central circuit. Enumerated as a typical electronic equipment is a personal computer, a portable type information terminal device and all the other household appliances. A computer for controlling a vehicle (automobiles or trains) may also be given as an example. The present invention is applicable also to such a semiconductor device.

When manufacturing the semiconductor device shown in this embodiment, any construction of Embodiments 1 through 4 may be employed and to use the embodiments in free combination is possible.

[Embodiment 7]

A CMOS circuit and a pixel matrix circuit formed through carrying out the present invention may be applied to various electro-optical devices (active matrix type liquid crystal display devices, active matrix type EL display devices, active matrix type EC display devices). Namely, the present invention may be embodied in all the electronic equipments that incorporate those electro-optical devices as display media.

As such an electronic equipment, a video camera, a digital camera, a projector (rear-type projector or front-type projector), a head mount display (goggle-type display), a navigation system for vehicles, a personal computer, and a portable information terminal (a mobile computer, a cellular phone, or an electronic book) may be enumerated. Examples of those are shown in FIGS. 8A to 9D.

Figure 8A:
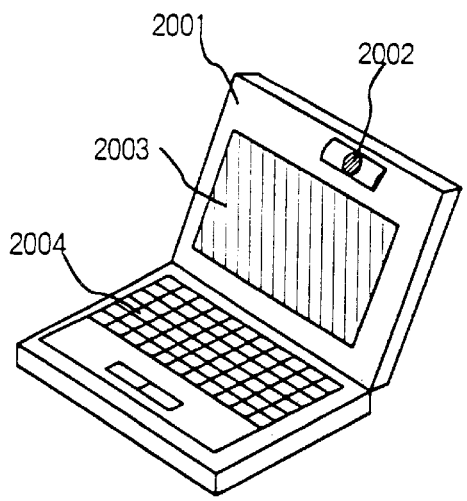
FIGS. 8A through 8F are views each showing an example of a semiconductor device (electronic equipment)

FIG. 8A shows a personal computer comprising a main body 2001, an image inputting unit 2002, a display device 2003, and a key board 2004. The present invention is applicable to the image inputting unit 2002, the display device 2003, and other signal control circuits.

Figure 8B:
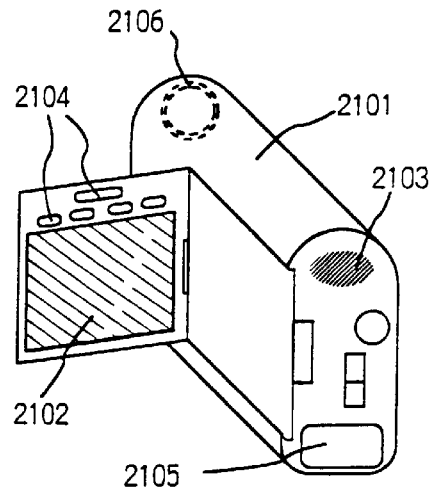

FIG. 8B shows a video camera comprising a main body 2101, a display device 2102, a voice input unit 2103, an operation switch 2104, a battery 2105, and an image receiving unit 2106. The present invention is applicable to the display device 2102, the voice input unit 2103, and other signal control circuits.

Figure 8C:
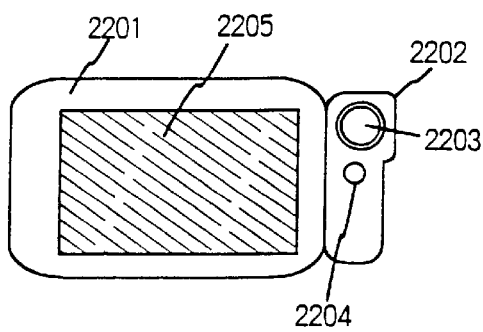

FIG. 8C shows a mobile computer comprising a main body 2201, a camera unit 2202, an image receiving unit 2203, an operation switch 2204, and a display device 2205. The present invention is applicable to the display device 2205 and other signal control circuits.

Figure 8D:
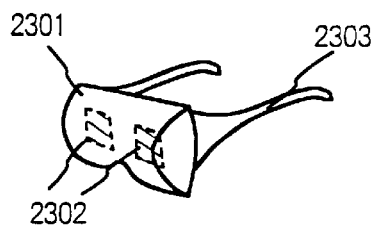

FIG. 8D shows a goggle-type display comprising a main body 2301, a display device 2302 and an arm portion 2303. The present invention is applicable to the display device 2302 and other signal control circuits.

Figure 8E:
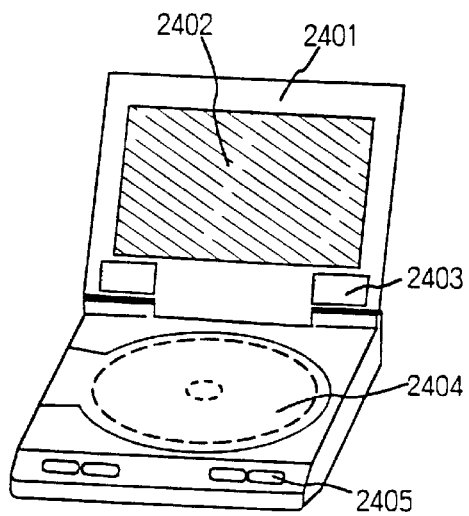

FIG. 8E shows a player that employs a recoding medium in which programs are recorded (hereinafter referred to as recording medium), and comprises a main body 2401, a display device 2402, a speaker unit 2403, a recording medium 2404, and an operation switch 2405. Incidentally, this player uses as the recoding medium a DVD (digital versatile disc), a CD and the like to serve as a tool for enjoying music or movies, for playing games and for connecting to the Internet. The present invention is applicable to the display device 2402 and other signal control circuits.

Figure 8F:
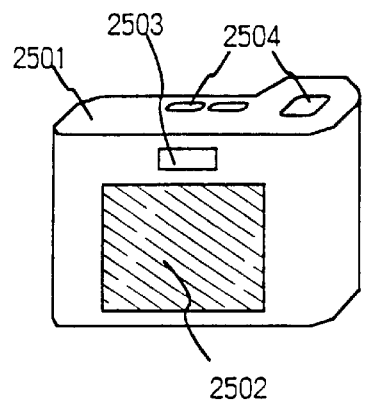

FIG. 8F shows a digital camera comprising a main body 2501, a display device 2502, an eye piece section 2503, an operation switch 2504, and an image receiving unit (not shown). The present invention is applicable to the display device 2502 and other signal control circuits.

FIG. 9A shows a front-type projector comprising a display device 2601 and a screen 2602. The present invention is applicable to the display device and other signal control circuits.

FIG. 9B shows a rear-type projector comprising a main body 2701, a display device 2702, a mirror 2703, and a screen 2704. The present invention is applicable to the display device and other signal control circuits.

FIG. 9C is a diagram showing an example of the structure of the display devices 2601 and 2702 in FIGS. 9A and 9B. The display device 2601 or 2702 comprises a light source optical system 2801, mirrors 2802 and 2804 to 2806, dichroic mirrors 2803, a prism 2807, liquid crystal display devices 2808, phase difference plates 2809, and a projection optical system 2810. The projection optical system 2810 consists of an optical system including a projection lens. This embodiment shows an example of three plate type", but not particularly limited thereto. For instance, the invention may be applied also to "single plate type". Further, in the light path indicated by an arrow in FIG. 9C, an optical system such as an optical lens, a film having a polarization function, a film for adjusting a phase difference, an IR film may be provided on discretion of a person who carries out the invention.

FIG. 9D is a diagram showing an example of the structure of the light source optical system 2801 in FIG. 9C. In this embodiment, the light source optical system 2801 comprises a reflector 2811, light sources 2812, 2813 and 2814, a polarization conversion device 2815, and a condenser lens 2816. The light source optical system shown in FIG. 9D is an example thereof, and is not particularly limited. For instance, on discretion of a person who carries out the invention, the light source optical system may be provided with an optical system such as an optical lens, a film having a polarization function, a film for adjusting the phase difference, and an IR film.

As described above, the present invention has so wide application range that it is applicable to electronic equipments in any fields. In addition, the electronic equipment of this embodiment may be realized with any construction obtained by combining Embodiments 1 to 7.

By carrying out the present invention, the process may be completed without exposing to the air, not even once, the interface of the active layer (on the main surface side or on the back surface side) that constructs the heart of the TFT, thereby realizing very clean interface.

With this construction, particularly the interface between an active layer and a gate insulating film, which influences electrical characteristics of a TFT, is kept clean and therefore a TFT exhibiting good electrical characteristics less in variation may be realized. In such a TFT, the threshold voltage, that is a typical parameter of a TFT, of −0.5 to 2 V in an N channel type TFT and of 0.5 to −2 V in a P channel type TFT may be realized. Also may be attained is a subthreshold coefficient (S value) of 0.1 to 0.3 V/decade.

What is claimed is:

1. A method of manufacturing a semiconductor device comprising the steps of:
    forming a gate wiring over a substrate having an insulating surface;
    sequentially forming a gate insulating film, a semiconductor film and a first protective film without exposing them to the air;
    irradiating said semiconductor film with a laser light through said first protective film to form a crystalline semiconductor film;
    forming a second protective film by patterning said first protective film;
    introducing an impurity element to said crystalline semiconductor film while using as a mask said second protective film; and
    patterning said crystalline semiconductor film into a semiconductor island to form an active layer.

2. A method of claim 1 wherein said gate wiring comprises a tantalum film or a laminated film in which a tantalum film and a tantalum nitride film are layered.

3. A method of claim 1 wherein said gate insulating film is a laminated film containing one layer of silicon nitride film.

4. A method of claim 1 wherein said gate insulating film is a laminated film containing one layer of BCB film.

5. A method of manufacturing a semiconductor device comprising the steps of:
    forming a gate wiring over a substrate having an insulating surface;
    sequentially forming a gate insulating film, a semiconductor film and a first protective film without exposing them to the air;
    irradiating said semiconductor film with ultraviolet light or infrared light through said first protective film to form a crystalline semiconductor film;
    forming a second protective film by patterning said first protective film;
    introducing an impurity element to said crystalline semiconductor film while using as a mask said second protective film;
    patterning said semiconductor film containing crystals into a semiconductor island to form an active layer; and
    etching said gate insulating film while using as a mask said active layer.

6. A method of claim 5 wherein said gate wiring comprises a tantalum film or a laminated film in which a tantalum film and a tantalum nitride film are layered.

7. A method of claim 5 wherein said gate insulating film is a laminated film containing one layer of silicon nitride film.

8. A method of claim 5 wherein said gate insulating film is a laminated film containing one layer of BCB film.

9. A method of manufacturing a thin film transistor comprising the steps of:
    forming a gate wiring over a substrate having an insulating surface;
    oxidizing said gate wiring to form a gate oxide film on a surface of said gate wiring;
    sequentially forming a gate insulating film, a semiconductor film and a first protective film without exposing them to the air;
    irradiating said semiconductor film with ultraviolet light or infrared light through said first protective film to form a crystalline semiconductor film;
    forming a second protective film by patterning said first protective film;
    introducing an impurity element to said crystalline semiconductor film while using as a mask said second protective film; and
    patterning said crystalline semiconductor film a semiconductor island to form an active layer.

10. A method of claim 9 wherein said gate wiring comprises a tantalum film or a laminated film in which a tantalum film and a tantalum nitride film are layered.

11. A method of claim 9 wherein said gate insulating film is a laminated film containing one layer of silicon nitride film.

12. A method of claim 9 wherein said gate insulating film is a laminated film containing one layer of BCB film.

13. A method of claim 9 wherein said gate oxide film is formed by a plasma oxidation method.

14. A method of manufacturing a semiconductor device comprising the steps of:
    forming a gate wiring over a substrate having an insulating surface;
    oxidizing said gate wiring to form a gate oxide film on a surface of said gate wiring film;
    sequentially forming a gate insulating film, a semiconductor film and a first protective film without exposing them to the air;
    irradiating said semiconductor film with ultraviolet light or infrared light through said first protective film to form a crystalline semiconductor film;
    forming a second protective film by patterning said first protective film;
    introducing an impurity element to said crystalline semiconductor film while using as a mask said second protective film;
    patterning said crystalline semiconductor film into a semiconductor island to form an active layer; and
    sequentially etching said gate insulating film and said gate oxide film while using as a mask said active layer.

15. A method of claim 14 wherein said gate wiring comprises a tantalum film or a laminated film in which a tantalum film and a tantalum nitride film are layered.

16. A method of claim 14 wherein said gate insulating film is a laminated film containing one layer of silicon nitride film.

17. A method of claim 14 wherein said gate insulating film is a laminated film containing one layer of BCB film.

18. A method of claim 14 wherein said gate oxide film is formed by a plasma oxidation method.

19. A method of manufacturing a thin film transistor comprising the steps of:

forming a gate wiring on an insulating surface;

sequentially forming a gate insulating film, a semiconductor film and a first protective film without exposing them to the air;

irradiating said semiconductor film with a laser light through said first protective film to form a crystalline semiconductor film;

forming a second protective film by patterning said first protective film; and introducing an impurity element to said crystalline semiconductor film to form impurity regions by using said second protective film as a mask.

20. A method of claim 19 wherein said gate wiring comprises a tantalum film or a laminated film in which a tantalum film and a tantalum nitride film are layered.

21. A method of claim 19 wherein said gate insulating film is a laminated film containing one layer of silicon nitride film.

22. A method of claim 19 wherein said gate insulating film is a laminated film containing one layer of BCB film.

23. A method of manufacturing a thin film transistor comprising the steps of:

forming a gate wiring on an insulating surface;

sequentially forming a gate insulating film, a semiconductor film and a first protective film without exposing them to the air;

irradiating said semiconductor film with a laser light through said first protective film to form a crystalline semiconductor film;

forming a second protective film by patterning said first protective film;

introducing a first impurity element to said crystalline semiconductor film to form first impurity regions by using said second protective film as a mask;

forming a third protective film by patterning said second protective film; and introducing a second impurity element to said crystalline semiconductor film to form second impurity regions by using said third protective film as the mask.

24. A method of claim 23 wherein said gate wiring comprises a tantalum film or a laminated film in which a tantalum film and a tantalum nitride film are layered.

25. A method of claim 23 wherein said gate insulating film is a laminated film containing one layer of silicon nitride film.

26. A method of claim 23 wherein said gate insulating film is a laminated film containing one layer of BCB film.

27. A method of manufacturing a thin film transistor comprising the steps of:

forming a gate wiring on an insulating surface;

sequentially forming a gate insulating film, a semiconductor film and a first protective film without exposing them to the air;

irradiating said semiconductor film with an infrared light through said first protective film to form a crystalline semiconductor film;

forming a second protective film by patterning said first protective film; and introducing an impurity element to said crystalline semiconductor film to form impurity regions by using said second protective film as a mask.

28. A method of claim 27 wherein said gate wiring comprises a tantalum film or a laminated film in which a tantalum film and a tantalum nitride film are layered.

29. A method of claim 27 wherein said gate insulating film is a laminated film containing one layer of silicon nitride film.

30. A method of claim 27 wherein said gate insulating film is a laminated film containing one layer of BCB film.

31. A method of manufacturing a thin film transistor comprising the steps of:

forming a gate wiring on an insulating surface;

sequentially forming a gate insulating film, a semiconductor film and a first protective film without exposing them to the air;

irradiating said semiconductor film with an infrared light through said first protective film to form a crystalline semiconductor film;

forming a second protective film by patterning said first protective film;

introducing a first impurity element to said crystalline semiconductor film to form first impurity regions by using said second protective film as a mask;

forming a third protective film by patterning said second protective film; and introducing a second impurity element to said crystalline semiconductor film to form second impurity regions by using said third protective film as the mask.

32. A method of claim 21 wherein said gate wiring comprises a tantalum film or a laminated film in which a tantalum film and a tantalum nitride film are layered.

33. A method of claim 21 wherein said gate insulating film is a laminated film containing one layer of silicon nitride film.

34. A method of claim 21 wherein said gate insulating film is a laminated film containing one layer of BCB film.

35. A method of claim 1 wherein said semiconductor device is incorporated into an electronic equipment selected from the group consisting of a video camera, a digital camera, a projector, a head mount display, a navigation system, a personal computer, and a portable information terminal.

36. A method of claim 5 wherein said semiconductor device is incorporated into an electronic equipment selected from the group consisting of a video camera, a digital camera, a projector, a head mount display, a navigation system, a personal computer, and a portable information terminal.

37. A method of claim 9 wherein said thin film transistor is incorporated into an electronic equipment selected from the group consisting of a video camera, a digital camera, a projector, a head mount display, a navigation system, a personal computer, and a portable information terminal.

38. A method of claim 19 wherein said thin film transistor is incorporated into an electronic equipment selected from the group consisting of a video camera, a digital camera, a projector, a head mount display, a navigation system, a personal computer, and a portable information terminal.

39. A method of claim 23 wherein said thin film transistor is incorporated into an electronic equipment selected from the group consisting of a video camera, a digital camera, a projector, a head mount display, a navigation system, a personal computer, and a portable information terminal.

40. A method of claim 27 wherein said thin film transistor is incorporated into an electronic equipment selected from the group consisting of a video camera, a digital camera, a projector, a head mount display, a navigation system, a personal computer, and a portable information terminal.

41. A method of claim 31 wherein said thin film transistor is incorporated into an electronic equipment selected from the group consisting of a video camera, a digital camera, a projector, a head mount display, a navigation system, a personal computer, and a portable information terminal.

* * * * *